United States Patent
Tapp et al.

(10) Patent No.: US 7,281,174 B1
(45) Date of Patent: Oct. 9, 2007

(54) DIVERSITY CODE COMBINING SCHEME FOR TURBO CODED SYSTEMS

(75) Inventors: Thomas L. Tapp, Cedar Rapids, IA (US); Richard A. Groshong, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 551 days.

(21) Appl. No.: 10/957,086

(22) Filed: Oct. 1, 2004

(51) Int. Cl.
G06F 11/00 (2006.01)
(52) U.S. Cl. .......................................... 714/701; 341/81
(58) Field of Classification Search .............. 714/701; 341/81
See application file for complete search history.

(56) References Cited

U.S. PATENT DOCUMENTS

| | | | |
|---|---|---|---|
| 6,298,463 B1 | 10/2001 | Bingeman et al. | |
| 6,304,991 B1 | 10/2001 | Rowitch et al. | |
| 6,351,832 B1 | 2/2002 | Wei | |
| 6,427,214 B1 | 7/2002 | Li et al. | |
| 6,484,283 B2 | 11/2002 | Stephen et al. | |
| 6,556,617 B1 * | 4/2003 | Tsujimoto | 375/141 |
| 6,594,792 B1 | 7/2003 | Hladik et al. | |
| 6,637,000 B2 | 10/2003 | Rowitch et al. | |
| 6,728,927 B2 | 4/2004 | Crozier | |
| 6,785,861 B2 * | 8/2004 | Scalise et al. | 714/786 |
| 6,956,842 B1 * | 10/2005 | Okumura et al. | 370/350 |
| 6,968,021 B1 * | 11/2005 | White et al. | 375/340 |
| 7,088,793 B1 * | 8/2006 | Mickelson et al. | 375/341 |
| 7,127,000 B2 * | 10/2006 | Wang et al. | 375/265 |
| 7,127,009 B2 * | 10/2006 | Berthet et al. | 375/341 |
| 7,130,443 B1 * | 10/2006 | Werner et al. | 382/100 |
| 7,142,610 B1 * | 11/2006 | Wang | 375/262 |
| 7,164,727 B2 * | 1/2007 | Wengerter et al. | 375/267 |
| 7,210,075 B2 * | 4/2007 | Ferrari et al. | 714/701 |

OTHER PUBLICATIONS

Li et al., Trellis-Coded Modulation With Bit Interleaving And Iterative Decoding, Apr. 1999, IEEE, vol. 17, No. 4.*
Ogiwara et al., Code Matched Interleaver For Parallel Concatenated Trellis Coded Modulation, 2002, IEEE.*
Ivanovs et al., "Continuous Phase Modulation (CPM) advantage compare with OQPSK (Offset Quadrant Phase Shift Key)", available at www.pdffactory.com, undated, (pp. 27-30).
Lampe et al., "Noncoherent Coded Continuous Phase Modulation", undated, (5 pgs).
Lampe et al., "Noncoherent Continuous-Phase Modulation for DS-CDMA", undated, (5 pgs).
Narayanan et al., "Performance of Trellis-Coded CPM with Iterative Demodulation and Decoding", *IEEE Transaction On Communications*, vol. 49, No. 4, Apr. 2001, (pp. 676-687).

(Continued)

*Primary Examiner*—Guy Lamarre
*Assistant Examiner*—Mujtaba K. Chaudry
(74) *Attorney, Agent, or Firm*—Nathan O. Jensen; Kyle Eppele

(57) ABSTRACT

A diversity code transmission system is disclosed. The diversity code transmission system comprises an encoder encoding a set of bits. The system also comprises an interleaver receiving the encoded bits and providing an output. A coder or modulator for providing a first transmission signal is also used. The interleaver iteratively receives its own output to provide an iterated output to a coder or modulator to provide a diversity transmission signal. The receiving system supports iterative decoding and joint iterative demodulation and decoding.

15 Claims, 3 Drawing Sheets

OTHER PUBLICATIONS

Sadjadpour et al., "Interleaver design for short block length Turbo codes", undated, (pp. 1-4).

Simon et al., "Maximum-Likelihood Block Detection of Noncoherent Continuous Phase Modulation", *IEEE Transactions On Communications,* vol. 41, No. 1, Jan. 1993, (pp. 90-98).

Svensson et al., "Constrained Envelope Continuous Phase Modulation", undated, (5 pgs.).

Tapp et al., "Turbo-Detected Coded Continuous-Phase Modulation For Military UHF Satellite Communications", *IEEE*, 2002, (pp. 148-151).

Tapp et al., "Turbo Detection of Coded Continuous-Phase Modulation", IEEE, 1999, (pp. 534-537).

De Veciana et al., "Neural Net-Based Continuous Phase Modulation Receivers", *IEEE Transactions On Communications,* vol. 40, No. 8, Aug. 1992, (pp. 1396-1408).

U.S. Patent Application titled "Burst Transmission Using A Spanning Interleaver For Serially Concatenated Continuous Phase Modulation Systems", filed Oct. 1, 2004, (12 pgs., 2 pgs. of drawings, (14 total pgs.)).

U.S. Patent Application titled "Reduced Complexity Soft-Output Noncoherent Continuous Phase Demodulator Systems", filed Oct. 1, 2004, (11 pgs., 9 pgs. of Appendices, 3 pgs. of drawings, (23 total pgs.)).

* cited by examiner

DIVERSITY CODE COMBINING SCHEME FOR TURBO CODED SYSTEMS

BACKGROUND

The present invention relates generally to data communications processes that enable high processing gains to be realized in systems requiring diversity transmissions. More specifically, the invention relates to a system and method of simplified interleaving for turbo coded or concatenated coded systems in which only a single interleaver is required and is used in an iterative manner in order to create diversity transmissions.

Conventionally, data communications systems, either voice or non-voice, make use of signal diversity or redundancy when transmitting information to provide an improvement in performance without compromising certain other aspects of the data transmissions system. Two conventional techniques which are used that add diversity are known as interleaving and forward-error correcting (FEC) coding.

Interleaving requires that an input data sequence is permuted or reordered into another sequence. For example a series of numbers (1, 2, 3, 4, 5, 6, 7, 8, 9, 0) may be reordered via a mathematical transformation into a different order (6, 5, 4, 1, 2, 0, 3, 8, 7, 9). The interleaving operation transposes the original position of each symbol in a finite input sequence to a new position by operation of the interleaver. This reordering process is called interleaving and may be performed in a number of ways.

When the signal is received at the transmission destination, the signal is again reordered, putting the data sequence back into the original order. This process is called de-interleaving and it is the inverse of the interleaving process.

Conventionally, FEC coding techniques are also used in the transmission process. Some of the best performing coding processes are turbo-codes. Conventionally a variety of turbo-code interleaver designs exist that require less complexity when decoding. Three of the most popular interleaver designs are 1) rectangular interleavers; 2) pseudo-random interleavers; and 3) S-random interleavers. Out of these the S-random interleavers are often seen to be better performing than the others. The S-random interleavers exploit the property of not mapping neighbor positions within a certain sequence length, to neighbor positions exhibiting the same length. The problem with using a S-random interleaver is that computing the address permutation in realtime is difficult and thus can limit the data rates when using this type of interleaver. Alternatively, the address permutation can be pre-computed and stored in memory to avoid realtime computations. However, this can require large memory storage for the highest performance turbo coded systems, because the turbo code performance is greatest when using large interleavers.

One turbo-code like FEC system is serially-concatenated convolutional coding and modulation with memory, such as continuous-phase modulation or differentially-encoded modulation. An interleaver is placed between the encoder and the modulator. This system is completely analogous to serially-concatenated convolutional codes, except that the inner code is replaced with the memory inherent in the modulation. As is conventionally done with turbo-like coding schemes, the receiver iterates between the inner decoder or demodulator and the outer decoder.

In conjunction with interleaving and FEC coding, repeat transmissions are often used to add time and frequency diversity to the data sequence.

Demodulation and decoding is typically performed by combining repeat transmissions and performing de-interleaving and FEC decoding.

Because of the computational complexity or large memory requirements, it may not be desirable to utilize multiple interleavers or large interleavers for implementing diversity transmission. Accordingly, there is a need for a system and method in which a single interleaver may be iteratively used to provide diversity transmissions.

It would be desirable to provide a system and/or method that provides one or more of these or other advantageous features. Other features and advantages will be made apparent from the present specification. The teachings disclosed extend to those embodiments which fall within the scope of the appended claims, regardless of whether they accomplish one or more of the aforementioned needs.

SUMMARY OF THE INVENTION

What is provided is a diversity code transmission system. The diversity code transmission system comprises an outer encoder, encoding a set of bits. The system also comprises an interleaver receiving the encoded bits and providing an output. The system further comprises an inner coder or modulator for providing a first transmission signal. For each subsequent diversity transmission, a different interleaver is employed, which provides an output to a continuous phase modulator to provide an additional diversity transmission signal.

What is also provided is a diversity code transmission system in which the kth diversity transmission uses an interleaver that is a concatenation of k copies of the first interleaver.

What is also provided is a method of demodulating a diversity transmission having L transmissions. The method comprises demodulating each transmission using an inner decoder or demodulator. The method also comprises passing the output of each inner decoder or demodulator to a de-interleaver. The method further comprises summing the output of all L de-interleavers. Further still, the method comprises decoding the output of the summation to provide a coded-bit output. Yet further still, the method comprises passing the decoded output to each of L interleavers, and providing the output of each interleaver back to its appropriate inner decoder or demodulator. Yet further still the method comprises each transmission again using an inner decoder or demodulator, using the output of the interleaver as an a priori input. Yet further still, the method comprises iteratively repeating the entire process either a fixed number of times or until some other appropriate stopping criteria have been met.

Further what is provided is a method for demodulating a diversity transmission having L transmissions, where the kth interleaver is a concatenation of k copies of a single interleaver, and each different de-interleaver is a concatenation of k copies of a single deinterleaver.

Further, what is provided is a method of generating a diversity transmission. The method comprises receiving a stream of bits. The method also comprises encoding the stream of bits to provide an encoded output. Further still, the method comprises interleaving the encoded output using an interleaver, to generate an interleaved output. Further still, the method comprises coding or modulating the interleaved output to generate a transmission and interleaving the interleaved output using the interleaver to produce an iterated interleaved output. Further still, the method comprises coding or modulating the iterated interleaved output to generate a transmission. Yet further still, the method comprises iteratively using the output of the interleaver as the input to the same interleaver in the next step.

Yet further what is provided is a system for generating a diversity transmission. The system comprises a means for receiving a stream of bits and a means for encoding a stream of bits to provide an encoded output. The system also comprises a means for interleaving the encoded output to generate an interleaved output and a means for coding or modulating the interleaved output to generate a transmission. The system further comprises a means for interleaving the interleaved output using the means for interleaving to produce an iterated interleaved output. Further still the system comprises a means for coding or modulating the iterated interleaved output to generate a transmission. Yet further still, the system comprises a means for iteratively using the output of the means for interleaving as the input to the same means for interleaving in the next step.

Alternative examples and other exemplary embodiments may also be provided which relate to other features and combination of features as may be generally recited in the claims.

BRIEF DESCRIPTION OF THE DRAWINGS

The invention will become more fully understood from the following detailed description, taken in conjunction with the accompanying drawings, wherein like reference numerals refer to like elements, in which.

DETAILED DESCRIPTION OF THE PREFERRED AND EXEMPLARY EMBODIMENTS

Figure 1:
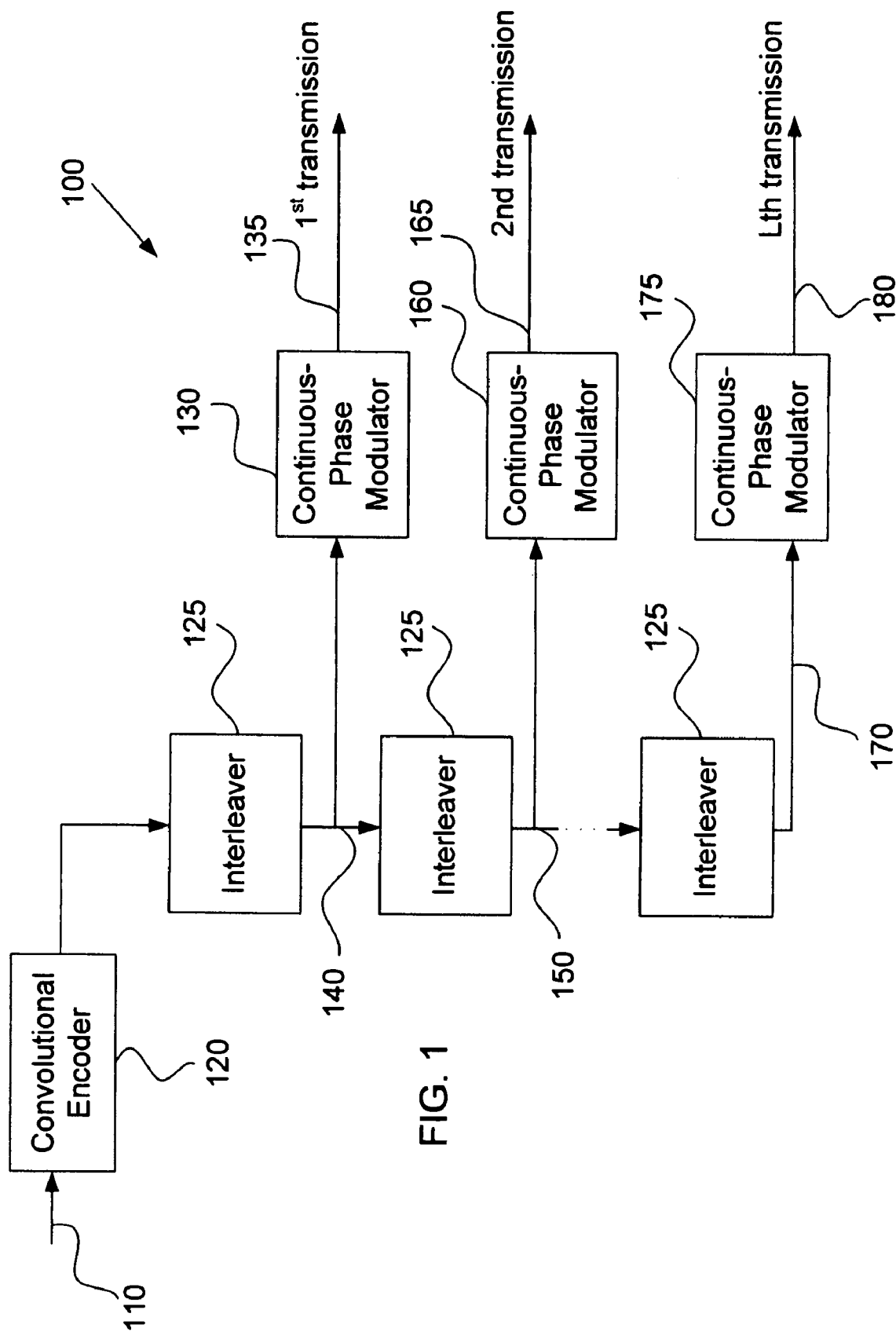
FIG. 1 is an exemplary block diagram of an iterative diversity transmission process.

Before describing in detail the particular improved system and method, it should be observed that the invention includes but is not limited to a novel structural combination of conventional data/signal processing components and communication circuits, and not in the particular detailed configurations thereof. Accordingly, the structure, methods, functions, control and arrangement of conventional components and circuits have, for the most part, been illustrated in the drawings by readily understandable block representations and schematic diagrams, in order not to obscure the disclosure the structural details which will be readily apparent in the art, having the benefit of the description herein. Further, the invention is not limited to the particular embodiments depicted in the exemplary diagrams, but should be construed in accordance with the language in the claims.

Referring to FIG. 1, a system 100 is depicted for providing diversity transmissions. Information bits 110 are provided to a convolutional encoder 120 where the information is encoded, and in a particular embodiment turbo-encoded. The encoded bits from encoder 120 are provided to an S-random interleaver 125. A signal comprising the transformed coded bits 140 is provided to a continuous phase modulator 130 to provide a first transmission 135. The transformed encoded bits 140 are also provided to S-random interleaver 125 to provide an output 150 which is provided to a continuous phase modulator 160 to provide a second transmission 165. The output 150 of S-random interleaver 125 is again provided, in an iterative process, through S-random interleaver 125 to provide an output 170 that is provided to a continuous phase modulator 175 to provide the Lth diversity transmission 180. In an exemplary embodiment continuous phase modulators 130, 160, and 175 may be the same continuous phase modulator. Also, in an exemplary embodiment the value for L may have a maximum value of 5, or may be any other applicable number. Accordingly, because S-random interleaver 125 is used iteratively over and over again, only one existence of S-random interleaver 125 need be stored in memory. In systems of the prior art, the S-random interleaver would be a different S-random interleaver for each of the L-transmissions. However using the iterative process, the same S-random interleaver may be repetitively used thereby saving on storage.

Figure 2:
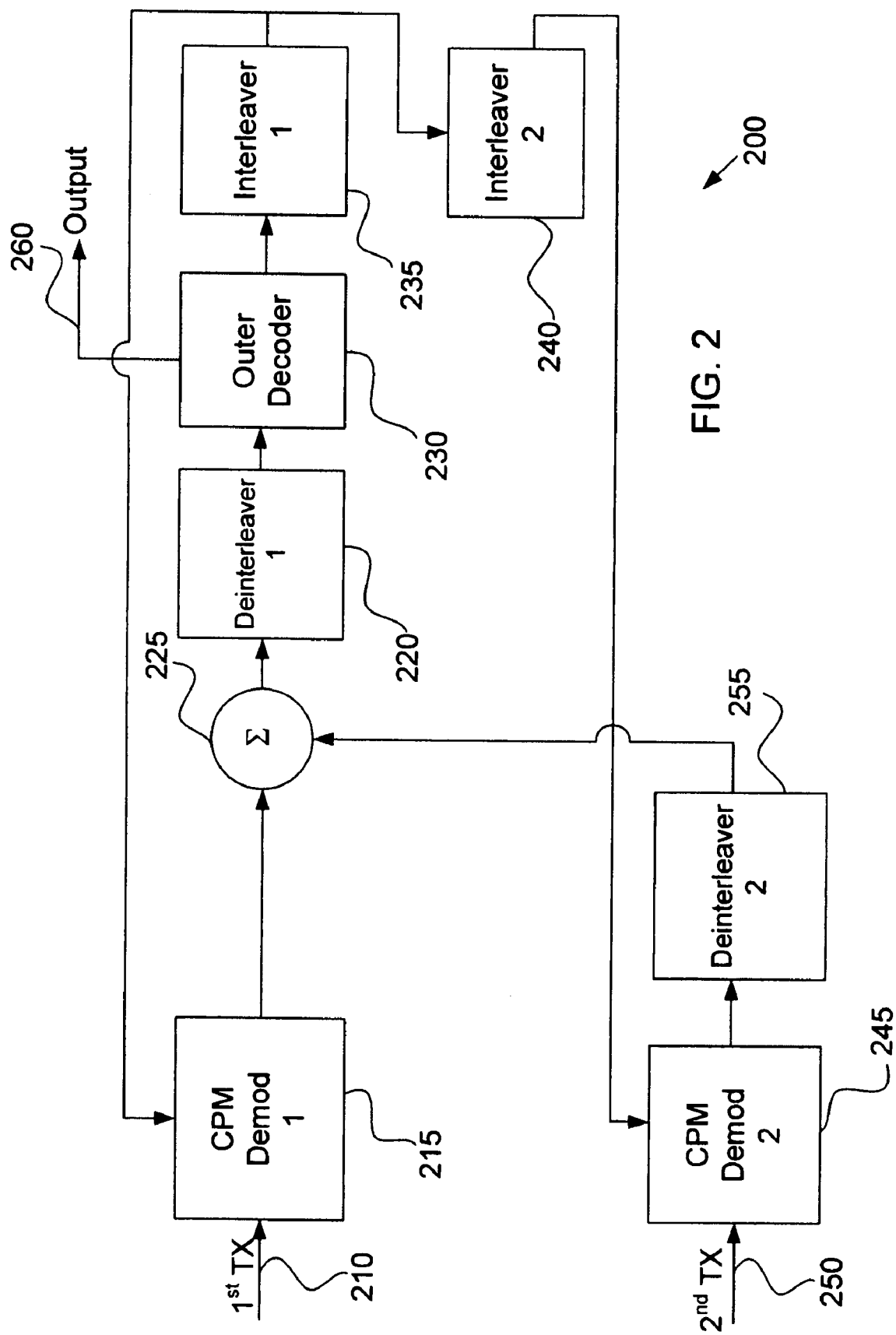
FIG. 2 is an exemplary block diagram of an iterative diversity transmission demodulation process.

With reference to FIG. 2, a diagram of a diversity transmission system using joint iterative demodulation and decoding 200 is depicted. Demodulation system 200 comprises a reception of a first transmission 210 by CPM demodulator #1 215. The reception of the second transmission 250 is processed by CPM demodulator #2 245 the output of which is passed to de-interleaver #2 255. Output of CPM demodulator #1 215 and de-interleaver #2 255 is passed to a summing junction 225. The output of summing junction 225 is passed to de-interleaver #1 220 the output of which is passed to an outer decoder 230 the output of which is passed to an interleaver #1 235 the output of which is passed to an interleaver #2 240. The output of interleaver #1 235 is passed back to CPM demodulator #1 215 and the output of interleaver #2 240 is passed to CPM demodulator #2 245.

This exemplary diagram depicts one iteration of a two level diversity reception. However, in the system provided in FIG. 1 there can be any number of diversity transmissions, and any number of iterations of the turbo loop demodulation and decoding process. In turbo decoding additional iterations improve the estimation of the decoded data and therefore improve system performance. The system of FIG. 2 may be expanded to any size without departing from the scope of the invention. Once the iterations have been carried out, outer decoder 230 provides an output 260.

Figure 3:
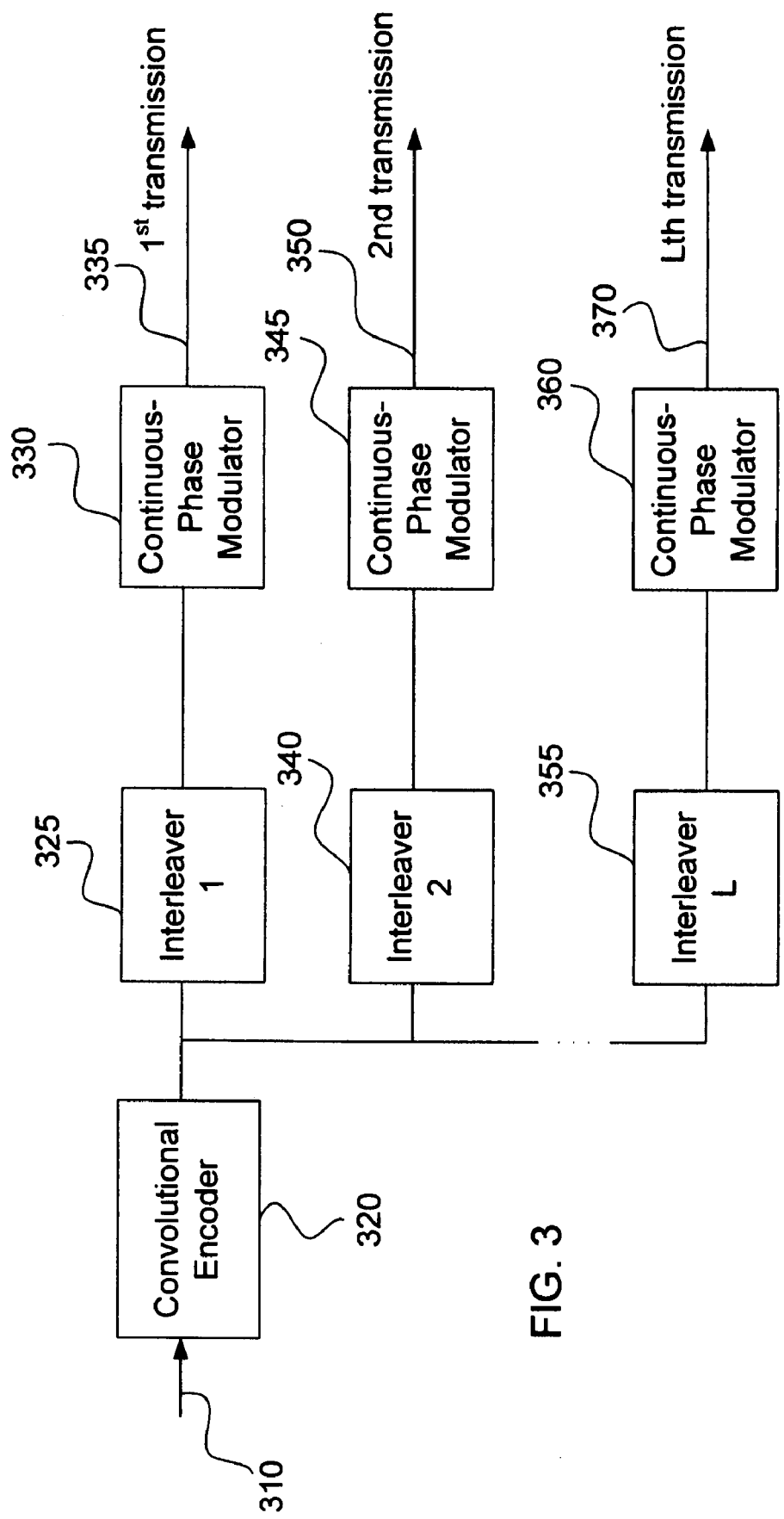
FIG. 3 is an exemplary block diagram of a diversity transmission process wing concatenated interleavers.

Referring to FIG. 3, a system 300 with concatenated interleavers is depicted for providing diversity transmissions. Information bits 310 are provided to a convolutional encoder 320 where the information is encoded, and in a particular embodiment turbo-encoded. The encoded bits from encoder 320 are provided to an interleaver #1 325. A signal comprising the transformed coded bits is provided to a continuous phase modulator 330 to provide a first transmission 335. The encoded bits from encoder 320 are also provided to interleaver #2 340 to provide an output to a continuous phase modulator 345 to provide a second transmission 350. The output of encoder 320 is also provided to interleaver L 355 to provide an output to a continuous phase modulator 360 to provide the Lth diversity transmission 370. In an exemplary embodiment, continuous phase modulators 330, 345, and 360 may be the same continuous phase modulator. Also, in an exemplary embodiment the value for L may have a maximum value of 5, or may be any other applicable number.

Because bursts transmitted over multiple frequencies (to counter the effects of frequency/selective fading and/or jamming) are often transmitted using repetition diversity, it is desirable to use an iterative interleaving scheme for providing such burst transmissions. Serially concatenated FEC coding and modulation conventionally consists of an outer convolutional encoder, an interleaver, and an inner coder or modulator with memory. In the burst transmission scheme, the interleaver is set to span exactly one burst. Using a different interleaver each transmission, additional interleaver gain is achievable. To minimize storage in the modem, an iterated interleaver approach, as discussed above may be used. For the L-th diversity transmission, the single interleaver is applied L times. Combining at the inner coder or demodulator is achieved by adding the log-likelihood extrinsic values from the demodulator for each diversity transmission.

While the detailed drawings, specific examples, and particular formulations given describe preferred and exemplary embodiments, they serve the purpose of illustration only. The inventions disclosed are not limited to the specific forms shown. For example, the methods may be performed in any of a variety of sequence of steps. The methods shown apply to general turbo coding as well as to joint iterative demodulation and decoding, as exemplified by the continuous phase modulation example. The hardware and software configurations shown and described may differ depending on the chosen performance characteristics and physical characteristics of the computing devices. For example, the type of computing device, communications bus, or processor used may differ. The systems and methods depicted and described are not limited to the precise details and conditions disclosed. Furthermore, other substitutions, modifications, changes, and omissions may be made in the design, operating conditions, and arrangement of the exemplary embodiments without departing from the scope of the invention as expressed in the appended claims.

What is claimed is:

1. A diversity code transmission system, comprising:
an encoder, encoding a set of bits;
an interleaver receiving the encoded bits and providing an output; and
a continuous phase modulator for providing a first transmission signal, wherein the interleaver iteratively receives its own output to provide an iterated output to the continuous phase modulator or to an additional continuous phase modulator to provide an iterated diversity transmission signal, and the number of iterations being a predetermined number such that the predetermined number of diversity transmissions are produced.

2. The system of claim 1, wherein the interleaver comprises an S-random interleaver.

3. The system of claim 1, wherein the interleaver comprises a block interleaver.

4. The system of claim 1, wherein the encoder comprises a turbo-encoder.

5. The system of claim 1, wherein the same continuous phase modulator is used repetitively.

6. A method of generating a diversity transmission, comprising;
receiving a stream of bits;
encoding the stream of bits to provide an encoded output;
interleaving the encoded output using an interleaver, to generate an interleaved output;
modulating the interleaved output to generate a first transmission;
interleaving the interleaved output using the interleaver to produce an iterated interleaved output;
modulating the iterated interleaved output to generate a second transmission; and
iteratively using the output of the interleaver as the input to the same interleaver.

7. The method of claim 6, wherein the interleaver comprises an S-random interleaver.

8. The method of claim 6, wherein the interleaver comprises a block interleaver.

9. The method of claim 6, wherein the encoder comprises a turbo-encoder.

10. The method of claim 6, wherein the same modulator comprises a continuous phase modulator.

11. A system for generating a diversity transmission, comprising:
a means for receiving a stream of bits;
a means for encoding the stream of bits to provide an encoded output;
a means for interleaving the encoded output, to generate an interleaved output;
a means for modulating the interleaved output to generate a first transmission;
a means for interleaving the interleaved output using the means for interleaving to produce an iterated interleaved output;
a means for modulating the iterated interleaved output to generate a second transmission; and
a means for iteratively using the output of the means for interleaving as the input to the same means for interleaving.

12. The system of claim 11, wherein the means for interleaving comprises an S-random interleaver.

13. The system of claim 11, wherein the means for interleaving comprises a block interleaver.

14. The system of claim 11, wherein the means for encoding comprises a turbo-encoder.

15. The system of claim 11, wherein the means for modulating comprises a continuous phase modulator.

* * * * *